United States Patent [19]

Grasso et al.

[11] Patent Number: 5,516,029
[45] Date of Patent: May 14, 1996

[54] METHOD AND APPARATUS FOR BONDING A SEMICONDUCTOR DEVICE

[75] Inventors: Antonino Grasso, Via Fasano; Antonio Pinto, Via Quieta, both of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 267,197

[22] Filed: Jun. 29, 1994

[30] Foreign Application Priority Data

Jun. 30, 1993 [EP] European Pat. Off. .............. 93830283

[51] Int. Cl.$^6$ .................................................. H01L 21/60
[52] U.S. Cl. .................... 228/180.5; 228/4.5; 228/44.7
[58] Field of Search ................................. 228/4.5, 44.7, 228/180.5

[56] References Cited

U.S. PATENT DOCUMENTS 3,218,702  11/1965  Steudler .
3,934,783  1/1976  Larrison ........................... 228/110.1

FOREIGN PATENT DOCUMENTS 719834   3/1980  U.S.S.R. ................................... 228/4.5
725845   4/1980  U.S.S.R. ................................... 228/44.7
2177639  1/1987  United Kingdom ........... B23K 20/10

OTHER PUBLICATIONS

Patent Abstracts of Japan, vol. 6, No. 111 (E–114)(989) Jun. 22, 1982 & JP–A–57040948 (Toshiba).

*Primary Examiner*—Kenneth J. Ramsey
*Attorney, Agent, or Firm*—David M. Driscoll; James H. Morris

[57] ABSTRACT

A method for connecting a wire lead between a semiconductor circuit chip and a corresponding terminal connector of a semiconductor device includes providing a bonding tool having a working end formed with at least a pair of grooves of different length, holding one end of the wire lead to the pin of the semiconductor device in one of said grooves and bonding it, and holding the other end of said wire to the chip in the other of said grooves an bonding it. The grooves have different lengths to allow for different wire spans across the bonded connection areas, on the chip and the pins.

16 Claims, 2 Drawing Sheets

5,516,029

METHOD AND APPARATUS FOR BONDING A SEMICONDUCTOR DEVICE

FIELD OF THE INVENTION

This invention relates to a method for connecting a wire lead between a semiconductor chip and corresponding terminal connector of a semiconductor device.

The invention also concerns an improved tool for implementing the method on stitch bonding equipment.

DISCUSSION OF THE RELATED ART

As is well known, in the specific field of this invention, there exists a need to establish electrical connections between a semiconductor chip and corresponding pins or rheophores on a supporting metal frame of the semiconductor device.

The connecting pins are formed integrally with the frame and allow the semiconductor circuit to be mounted on and connected to a pre-printed electronic board.

Provided on the semiconductor chip periphery are predetermined contact pads which are to be connected to corresponding pins of the semiconductor device; thin wires are connected between said pads and inward ends of the corresponding pins.

This step of providing the electrical connections between the semiconductor chip and the corresponding pins is obviously critical.

In fact, at this stage of the semiconductor circuit manufacturing process, a chip has already passed an electric test checking the proper operation of its circuitry.

Therefore, should the wire connections be performed in anything less than a workmanlike fashion, there is a material risk that the circuit will not operate correctly.

An even more undesirable and dangerous event is that the device is initially found in proper working condition, but it fails to operate after some time of use.

The importance of having the wire connection bonding carried out in a truly reliable manner is, therefore, self-evident.

To this aim, special equipment such as the stitch bonding machines have been developed. Each machine includes at its tooling end a bonding tool head driven automatically toward and away from a silicon chip mounted on a central portion of the frame.

While achieving its basic objective, such conventional equipment hasn't yet attained a sufficient reliability level to ensure faultless bonding of the wires.

Furthermore, the trend of today's technologies favors increased miniaturization on the semiconductor chip, which further reduces the area available for bonded wire connections.

The underlying technical problem solved by the present invention is to provide a method for improving the quality of the connections between a semiconductor circuit chip and the pins of its supporting frame, which overcomes the inherent limitations of the prior art solutions.

SUMMARY OF THE INVENTION

In accordance with the invention, a method for connecting a wire lead between a bonding pad on a semiconductor chip and a terminal of a semiconductor device includes providing a bonding tool with a first groove and a second groove, bonding a first end of the wire lead to the terminal with the first groove of the bonding tool and bonding a second end of the wire lead to the bonding pad with the second groove of the bonding tool.

A second aspect of the invention is an improved bonding tool having a first groove and a second groove formed in an end of the bonding tool.

The features and advantages of the method according to this invention will become apparent from the following description of an embodiment thereof, given by way of illustration and not of limitation with reference to the accompanying drawings.

DETAILED DESCRIPTION

Figure 1:
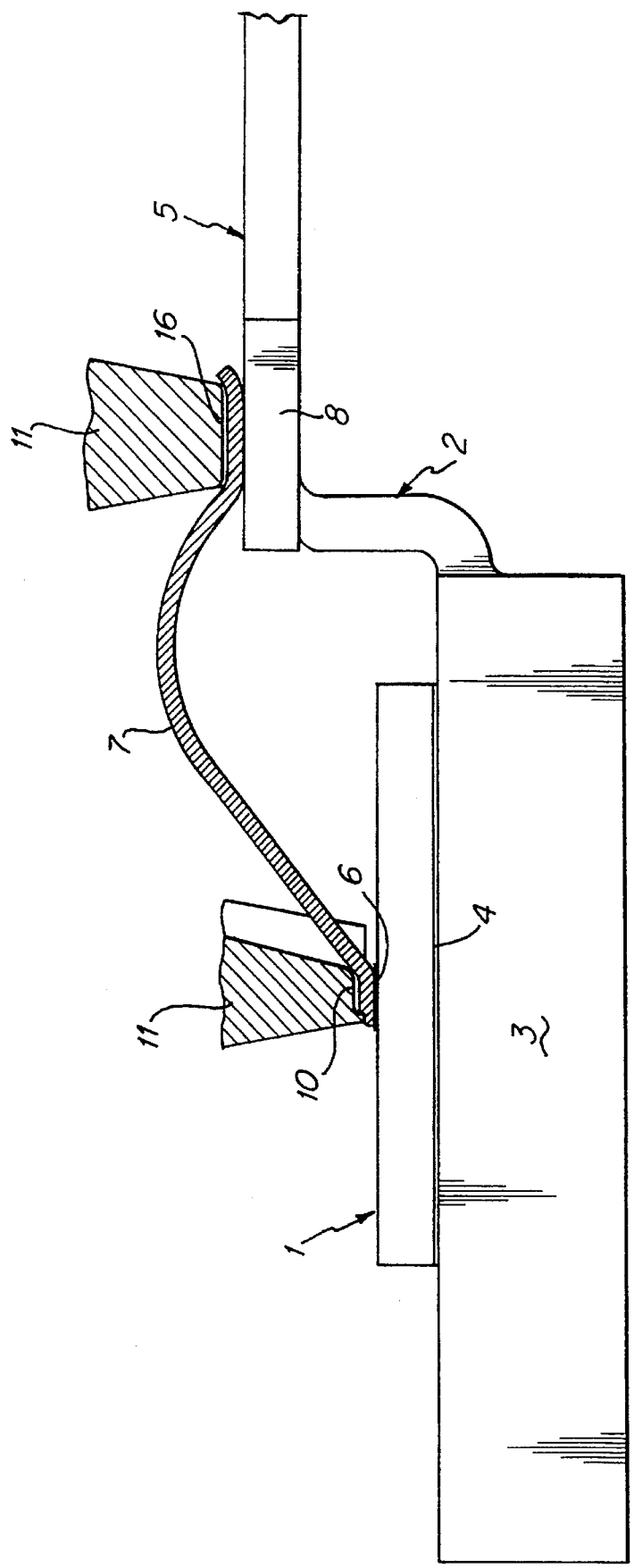
FIG. 1 shows, partly in cross-section, a schematic view of a semiconductor chip mounted on a supporting frame and undergoing a wire bonding process according to the inventive method.

With reference to the drawing views, generally and schematically shown at 1 is a chip of a semiconductor material, such as silicon, on which an electronic circuit has been realized.

The chip 1 is supported on and bonded to a central portion 3 of a frame 2 formed by a thin metal sheet.

Understandably, the chip 1 and frame 2 contact each other along the surface 4 of the semiconductor substrate, while the circuit is in full view on the exposed surface of the chip.

The frame 2 is formed integrally with plural connection terminals consisting substantially of contact pins 5 which, completing the manufacturing process, may be plugged on a pre-printed electronic board.

A wire lead 7 is bonded between each of pins 5 and a corresponding contact pad on the chip 1. Specifically, the wire is bonded to an inward end or post lead 8 of the pin 5 and to a pad 6 on the chip.

Shown by way of example in FIG. 1 is a wire 7 elongated between the post lead 8 of a pin 5 and a contact pad 6 located peripherally on the chip 1.

The opposite ends of the wire 7 are, therefore, bonded to the end 8 of the pin 5 and to the connection pad 6, respectively.

For this purpose, a stitch bonding type of equipment, only partially shown, is provided. This equipment carries at its working end a bonding tool head which can be driven automatically toward and away from the silicon chip 1 mounted on the frame 2, as well as to and from the pins 5.

Specifically, the tool head comprises a bonding tip 11 adapted to abut both against one end of a wire 7 to be bonded to the pad 6 and to the other end of the wire 7 to be bonded to the pin 5.

Figure 2:
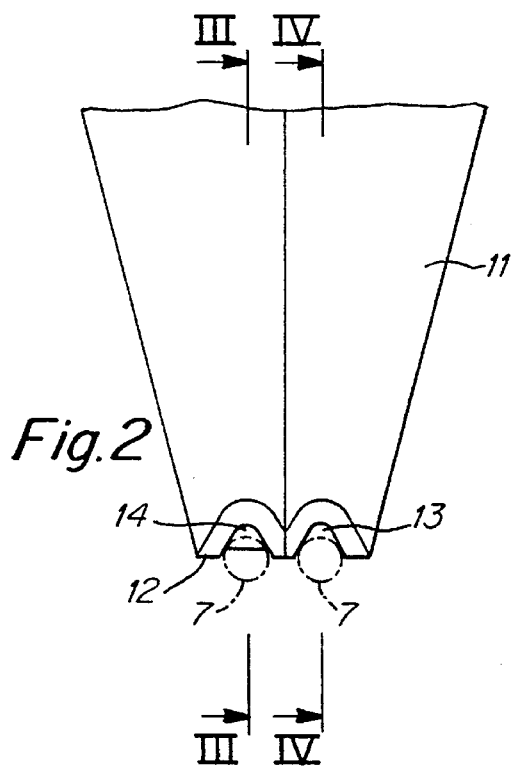
FIG. 2 is a schematic view of tool head, according to the invention, as applied to stitch bonding equipment for implementing the process of FIG. 1.

Referring to FIG. 2, advantageously, according to the invention, the tip 11 has a grooved bottom end 12 through which the connecting wire is run.

More particularly, a pair of parallel grooves 13, 14 extend along end 12. The grooves 13, 14 are substantially V-shaped in cross-section, with a flare angle of approximately sixty degrees.

In addition, the grooves 13, 14 have different lengths. Preferably, and contingent on individual requirements, the first-mentioned groove 13 is about one third to one half longer than the second-mentioned groove 14.

Figure 4:
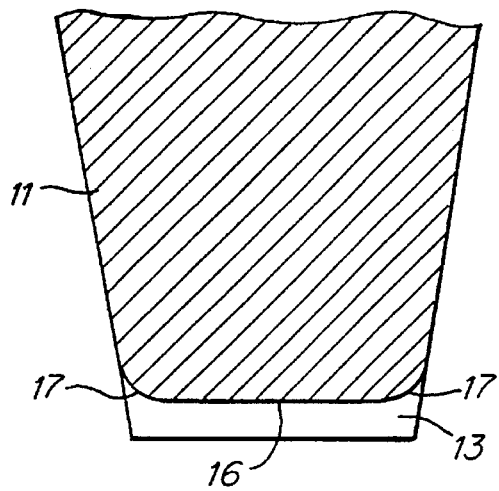
FIG. 4 is a vertical section view of the tool shown in FIG. 2, taken along line IV—IV.

The first groove 13 has a substantially straight-line profile shape 16 with curved opposite ends 17, as shown in FIG. 4.

Figure 3:
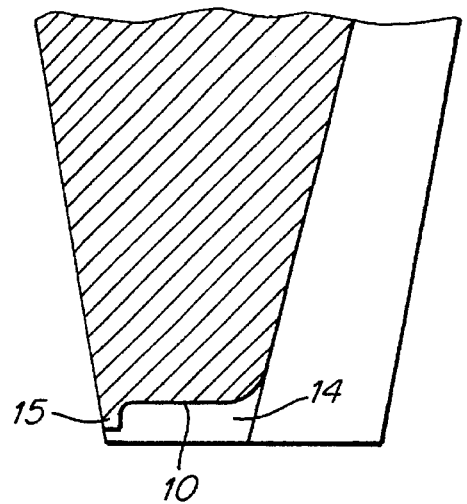
FIG. 3 is a vertical section view, taken along line III—III through the tool shown in FIG. 2.
Figure 5:
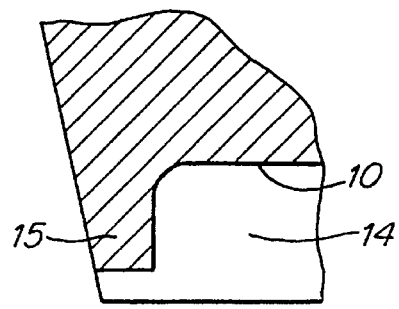
FIG. 5 is an enlarged scale detail view of the tool in FIG. 3.

The second groove 14 is instead closed at one end by a depending pip 15. The profile shape 10 of this second groove 14 is shown in FIG. 3. An enlarged view of the curved profile between the pip 15 and the line 10 of the groove 14 is shown in FIG. 5.

The bonding method of this invention will now be described by referring to FIG. 1.

While the wire is being bonded to the end 8 of the pin 5, it is held in the first groove 13, as shown on the right in FIG. 1.

Bonding is performed with the aid of ultrasound, or using another equivalent technique.

Thereafter, the bonding equipment is operated automatically to bring the tip 11 to a pad 6 on the chip 1 whereto the other end of the wire 7 will be bonded.

However, the wire end is presently held in the second groove 14 while being bonded, all this being shown on the left side of FIG. 1.

During this step of the bonding process, the pip 15 will indent and penetrate the wire 7 to weaken its cross-section, but this does not harm the bonded joint, even upon the wire being severed by a sharp pull as is customarily applied to thin wires.

The method and apparatus according to the invention do solve the technical problems of the prior art and afford several advantages, outstanding among which is that the bonded wire connections are more effective and reliable than those to be obtained with prior art techniques.

The differential groove tool, in fact, produces bonded connections to pads and pins which are appropriate for the space and dimensions available at the respective points of contact.

It will be appreciated that modifications and changes may be made unto the method and apparatus of this invention without departing from the invention scope as defined in the appended claims. Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A method for connecting a wire lead between a respective pad on a semiconductor chip and a corresponding terminal pin of a semiconductor device comprising the steps of:

providing a bonding tool including a working end having a surface with a width, a first length, and a second length, the first and second lengths of the surface being different, the first length of the surface having a first groove and the second length of the surface having a second groove;

holding a first end of the wire lead to the terminal pin in the first groove and bonding the wire to the terminal pin; and holding a second end of the wire to the bonding pad of the semiconductor chip and bonding it to the respective bonding pad.

2. The method according to claim 1, wherein said first groove has a length which is longer than a length of said second groove.

3. The method according to claim 1 wherein the step of bonding the wire to the bonding pad of semiconductor chip includes indenting the second end of the wire by means of a pip depending from an end of said second groove, the pip terminating such that a space is formed between the pip and the surface of the tool.

4. The method according to claim 1, wherein the bond to the terminal pin of the semiconductor device is restricted to a peripheral portion of the terminal pin which confronts an edge of the semiconductor chip.

5. The method according to claim 1, wherein each of the bondings is performed using a stitch wire bonding technique.

6. A bonding tool, for use with bonding equipment operated in a stitch bonding mode, for bonding a wire lead between a bonding pad of a semiconductor chip and a corresponding terminal pin of a semiconductor device, wherein the bonding tool comprises a bonding tip, including an end having a surface with a width, a first length, and a second length, the first length of the surface having a first wire-holding groove and the second length of said surface having a second wire-holding groove, the first wire holding groove and the second wire-holding groove having different lengths.

7. The bonding tool according to claim 6, wherein the first wire-holding groove and the second wire-holding groove are disposed in parallel.

8. A bonding tool, for use with bonding equipment operated in a stitch bonding mode, for bonding a wire lead between a bonding pad of a semiconductor chip and a corresponding terminal pin of a semiconductor device, wherein the bonding tool comprises a bonding tip having a first end formed with a first wire-holding groove and a second wire-holding groove, the first wire holding groove and the second wire-holding groove having different lengths, wherein the first groove has a length is in a range of one third to one half longer than a length of the second groove.

9. A bonding tool, for use with bonding equipment operated in a stitch bonding mode, for bonding a wire lead between a bonding pad of a semiconductor chip and a corresponding terminal pin of a semiconductor device, wherein the bonding tool comprises a bonding tip having a first end formed with a first wire-holding groove and a second wire-holding groove, the first wire-holding groove and the second wire-holding groove having different lengths, wherein the first wire-holding groove and the second wire-holding groove are substantially V-shaped in cross-section with a flare angle of substantially sixty degrees.

10. The bonding tool according to claim 6, wherein the second wire-holding groove is closed at one end by a pip depending from the second wire-holding groove, the pip terminating such that a space is formed between the pip and the surface of the tool.

11. The bonding tool according to claim 6, wherein the first wire-holding groove has a substantially straight-line profile shape with curved opposite ends.

12. A method for bonding a respective bonding area on a semiconductor chip to a respective pin of a semiconductor device, comprising the steps of:

holding a wire lead in a first groove of a bonding tool, the first groove having a first length:

forming a first bonding contact between the wire lead and the respective pin;

holding a second end of the wire lead in a second groove of the bonding tool, the second groove having a second length, the first length being in the range of ⅓ to ½ longer than the second length; and forming a second bonding contact between the wire lead and the respective bonding area on the semiconductor chip.

13. A bonding tool for use with bonding equipment operated in a stitch bonding mode, for bonding a wire lead between a bonding pad of a semiconductor chip and a corresponding terminal pin of a semiconductor device, wherein the bonding tool comprises a bonding tip including an end having a surface with a width, a first length, and a second length, the first and second lengths being different, the first length of the surface having a first means for holding a wire lead and the second length of the surface having a second means for holding the wire lead.

14. The bonding tool according to claim 13, wherein the first wire-holding means has a length which is longer than a length of the second wire holding means.

15. The bonding tool according to claim 13, wherein the first wire holding means and the second wire holding means are disposed in parallel.

16. A bonding tool for use with bonding equipment operated in a stitch bonding mode, for bonding a wire lead between a bonding pad of a semiconductor chip and a corresponding terminal pin of a semiconductor device, wherein the bonding tool comprises a bonding tip having a first end formed with a first means for holding a wire lead and a second means for holding the wire lead, wherein the first wire holding means has a length in a range of ⅓ to ½ longer than a length of the second wire holding means.

* * * * *